United States Patent [19]
Yoshikawa et al.

[11] Patent Number: 6,103,640
[45] Date of Patent: *Aug. 15, 2000

[54] ELECTROMAGNETIC-WAVE SHIELDING AND LIGHT TRANSMITTING PLATE

[75] Inventors: Masato Yoshikawa; Yasuhiro Morimura, both of Tokyo, Japan

[73] Assignee: Bridgestone Corporation, Tokyo, Japan

[*] Notice: This patent is subject to a terminal disclaimer.

[21] Appl. No.: 09/149,171

[22] Filed: Sep. 8, 1998

[30] Foreign Application Priority Data

Sep. 12, 1997 [JP] Japan ................................ 9-248530
Sep. 12, 1997 [JP] Japan ................................ 9-248531

[51] Int. Cl.⁷ .................................................. B32B 15/02
[52] U.S. Cl. ............................... 442/16; 442/18; 428/194
[58] Field of Search .................... 442/16, 18; 428/99, 428/194

[56] References Cited

U.S. PATENT DOCUMENTS 4,246,613  1/1981  Choder et al. .
5,855,988  1/1999  Matsuo .................................... 428/195

FOREIGN PATENT DOCUMENTS 0 059 063   9/1982   European Pat. Off. .
0 413 580   2/1991   European Pat. Off. .
9-147752    6/1997   Japan .
93/00221    1/1993   WIPO .
96/06520    2/1996   WIPO .

OTHER PUBLICATIONS

Patent Abstracts of Japan, vol. 097, No. 010, Oct. 31, 1997 & JP09 147752A (Fujitsu General Ltd.), Jun. 6, 1997.

R. Hasan: "A Study of Materials and Methods for EMI Shielding of Displays" SID International Symposium Digest, May 24, 1988, pp. 185–188, XP000092402.

*Primary Examiner*—Blaine Copenheaver
*Assistant Examiner*—Ula C. Ruddock
*Attorney, Agent, or Firm*—Kanesaka & Takeuchi

[57] ABSTRACT

An electromagnetic-wave shielding and light transmitting plate is provided which is formed of two transparent base plates and a conductive mesh member. The conductive mesh member 3 is interposed between two transparent base plates and is bonded together to form an integrated member and the margins of the conductive mesh member are folded along the peripheral edges of one of the transparent base plates and are secured to the transparent base plate with a conductive adhesive tape. This structure allows easy assemblage of the electromagnetic-wave shielding and light transmitting plate to a body of an equipment and provides uniform and low-resistant conduction between the electromagnetic-wave shielding and light transmitting plate and the body.

5 Claims, 1 Drawing Sheet

6,103,640

ELECTROMAGNETIC-WAVE SHIELDING AND LIGHT TRANSMITTING PLATE

FIELD OF THE INVENTION

The present invention relates to an electromagnetic-wave shielding and light transmitting plate suitable for a front filter for a PDP (plasma display panel), and more particularly, to an electromagnetic-wave shielding and light transmitting plate which can be easily built in a body of an equipment such as an office automation apparatus and can provide good current conduction relative to the body of the equipment.

BACKGROUND OF THE INVENTION

With the spread of electronic appliances including office automation apparatuses and communication instruments, electromagnetic wave emission from these appliances has come into a problem. That is, adverse effect of electromagnetic wave to the human body is feared and it is also a problem that the electromagnetic wave affects a precision apparatus to cause malfunction.

Therefore, plates having good electromagnetic-wave shielding efficiency and light transparency have developed as front filters for PDPs of the office automation apparatuses and come into commercial use. Such plates are also used as windows of a place where a precision apparatus is installed, such as a hospital or a laboratory in order to protect the precision apparatus from electromagnetic waves of a portable telephone.

A conventional electromagnetic-wave shielding and light transmitting plate typically comprises transparent base plates such as acrylic boards and a conductive mesh member like a wire netting or a transparent conductive film and is formed by interposing the conductive mesh member or the transparent conductive film between the transparent base plates and by assembling them.

In order to provide good electromagnetic-wave shielding efficiency when such an electromagnetic-wave shielding and light transmitting plate is assembled in a body of an equipment such as PDP, it is necessary to provide uniform current conduction between the electromagnetic-wave shielding and light transmitting plate and the body of the equipment, that is, between the conductive mesh of the electromagnetic-wave shielding and light transmitting plate and a conduction surface of the body.

A structure, which can provide good current conduction between an electromagnetic-wave shielding and light transmitting plate and a body of an equipment but is simple, has conventionally proposed (JPA 9-147752). This structure is made by forming a conductive mesh member in such a size that the periphery thereof is positioned outside of peripheral edges of transparent base plates so as to form margins when it is interposed therebetween, then folding the margins on the surface of one of the transparent base plates so that the margins function as conductive portions between the electromagnetic-wave shielding and light transmitting plate and the body of the equipment, and bonding the margins to the body of the equipment by pressure bonding.

However, there are the following problems with regard to such a structure as mentioned above:

1) there is a case that the conductive mesh is frayed so as not to provide good current conduction; and 2) it is difficult to fold the margins because of high toughness of the conductive mesh, and it is also difficult to bond the margins to the body of the equipment since the margins tend to be out of positions.

Therefore, the aforementioned structure has a shortcoming that it is difficult to securely provide good current conduction, which is uniform through the entire periphery of the electromagnetic-wave shielding and light transmitting plate, with low resistance.

OBJECT AND SUMMARY OF THE INVENTION

It is an object of the present invention to solve the above conventional problems and to provide an electromagnetic-wave shielding and light transmitting plate which can be easily built in the body of an equipment and can provide uniform and low-resistant conduction relative to the body of the equipment.

An electromagnetic-wave shielding and light transmitting plate of the present invention comprises two transparent base plates and a conductive mesh member. The conductive mesh member is interposed between the transparent base plates in such a manner that the periphery of the conductive mesh member is positioned outside of the transparent base plates and the periphery is folded along the peripheral edges of the transparent base plate. In the electromagnetic-wave shielding and light transmitting plate, the periphery of the conductive mesh member positioned outside of the transparent base plates is secured to the transparent base plates by a conductive adhesive tape.

The periphery of the conductive mesh member positioned outside of the transparent base plates is secured to the transparent base plate by using the conductive adhesive tape, thereby preventing the conductive mesh member from being frayed and stably securing the periphery. Therefore, the electromagnetic-wave shielding and light transmitting plate can be easily assembled to the body of the equipment and good conduction can be provided between the conductive mesh member of the electromagnetic-wave shielding and light transmitting plate and the body of the equipment through the conductive adhesive tape.

DETAILED DESCRIPTION OF PREFERRED EMBODIMENTS

Figure 1:
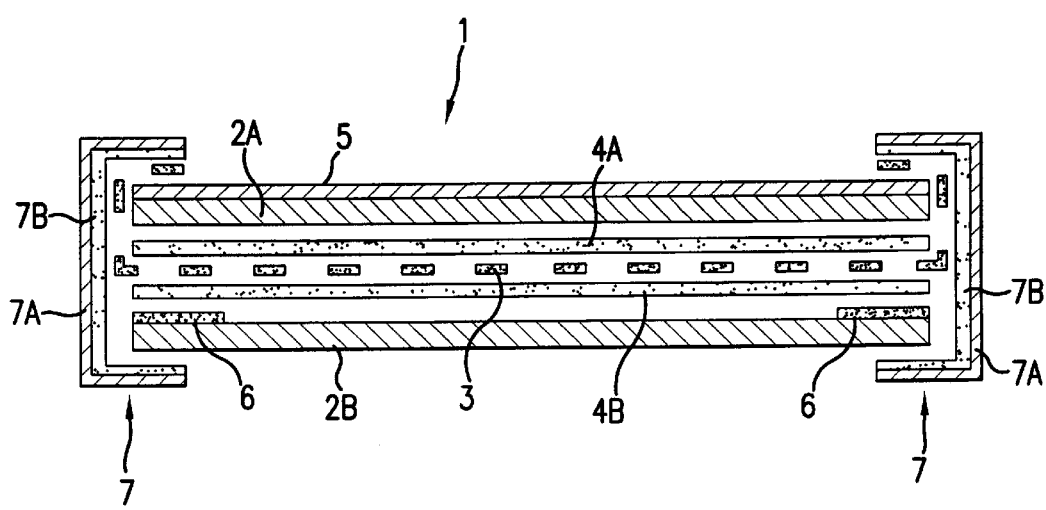
FIG. 1 is a schematic sectional view showing an embodiment of an electromagnetic-wave shielding and light transmitting plate according to the present invention.

Hereinafter, an embodiment of an electromagnetic-wave shielding and light transmitting plate of the invention will be described with reference to the drawing.

FIG. 1 is a schematic sectional view showing the embodiment of the electromagnetic-wave shielding and light transmitting plate of the present invention.

The electromagnetic-wave shielding and light transmitting plate 1 comprises two transparent base plates 2A, 2B and a conductive mash member 3 interposed between adhesive films 4A, 4B. The conductive mesh member 3 with adhesive films 4A, 4B is interposed between the transparent base plates 2A, 2B and is integrally bonded together to form an integrated member. The margins of the conductive mesh member 3 positioned outside of the peripheral edges of the transparent base plates 2A, 2B are folded along the peripheral edges of the transparent base plates 2A, 2B and are bonded to the transparent plates 2A, 2B with a conductive adhesive tape 7. In this manner, the electromagnetic-wave shielding and light transmitting plate 1 is formed.

In this embodiment, the conductive adhesive tape 7 is bonded to all around ends of the integrated member of the transparent base plates 2A, 2B and the conductive mesh member 3 in such a manner as to cover corners between surfaces and the end faces so that the conductive adhesive tape 7 is bonded to outside edges of both transparent base plates 2A, 2B.

The conductive adhesive tape 7 is formed, for example, by laying a conductive adhesive layer 7B on one surface of a metallic foil 7A. The metallic foil 7A for the conductive adhesive tape 7 may have a thickness of 1 to 100 μm and may be made of metal such as copper, silver, nickel, aluminum, or stainless steel.

The conductive adhesive layer 7B is formed by applying adhesive material, in which conductive particles are dispersed, onto one surface of the metallic foil 7A.

Examples of the adhesive material include epoxy or phenolic resin containing hardener, acrylic adhesive compound, rubber adhesive compound, silicone adhesive compound and the like.

Conductive materials of any type having good electrical conductivities may be employed as the conductive particles to be dispersed in the adhesive. Examples include metallic powder of for example, copper, silver, and nickel, metallic oxide powder of, for example, tin oxide, tin indium oxide, and zinic oxide, and resin or ceramic powder coated with such a metal or metallic oxide as mentioned above. There is no specific limitation on its configuration so that the particles may have any configuration such as palea-like, dendritic, granular, pellet-like, spherical, stellar, or confetto-like (spherical with many projections) configuration.

The content of the conductive particles is preferably 0.1–15% by volume relative to the adhesive and the average particle size is preferably 0.1–100 μm.

The thickness of the adhesive layer 7B is in a range from 5 to 100 μm in a normal case.

According to the present invention, the conductive adhesive tape 7 may be a cross-linkable conductive adhesive tape.

Use of the conductive adhesive tape of cross-linked type, in particular, having a post-cross-linkable adhesive layer containing ethylene-vinyl acetate copolymer and cross-linking agent for the ethylene-vinyl acetate copolymer enables effective assemblage because of the following characteristics:

(i) good adhesion properties, thereby allowing easy temporal adhesion to an adherend with suitable tack;

(ii) suitable tackiness before cross-linking, i.e. enough for the temporal adhesion but not so strong as to allow re-adhesion, thereby facilitating the amendment;

(iii) very strong tackiness after cross-linking, thereby exhibiting high bond strength;

(iv) high moisture and heat resistance, thereby exhibiting high durability; and (v) cross-linkable at a temperature lower than 130° C. in case of thermal cross-linking and cross-linkable even with light. The cross linking can be conducted at a relatively low temperature, thereby facilitating the adhesion operation.

Hereinafter, the structure of the cross-linkable conductive tape suitable for the present invention will be described.

The cross-linkable conductive tape used in the present invention preferably comprises a metallic foil 7A and an adhesive layer 7B, in which conductive particles are dispersed, disposed on one surface of the metallic foil 7A, wherein the adhesive layer 7B is a post-cross-linkable adhesive layer including polymer, of which the principal component is ethylene-vinyl acetate copolymer, and a cross-linking agent for the ethylene-vinyl acetate copolymer.

Examples of the conductive particles to be dispersed in the adhesive layer 7B include the examples given for the conductive particles to be dispersed in the adhesive of the aforementioned conductive adhesive tape 7.

The content of the conductive particles is preferably 0.1–15% by volume relative to the polymer, described later, forming the adhesive layer 7B and the average particle size is preferably 0.1–100 μm. Such limitation on the content and the particle size prevents condensation of the conductive particles, thereby providing good current conduction.

The polymer forming the adhesive layer 7B preferably contains, as the principal component thereof, ethylene-vinyl acetate copolymer selected from the following (A) through (C) and has melt index (MFR) from 1 to 3000, preferably from 1 to 1000, and more preferably from 1 to 800.

Use of the following copolymers (A) through (C), of which MFR is in a range from 1 to 3000 and of which vinyl acetate content is in a range from 2 to 80% by weight, improves tackiness before cross-linking to improve the working efficiency and rises the three-dimensional cross-linking density after cross-linking, thereby exhibiting quite high bond strength and also improving the moisture and heat resistance:

(A) ethylene-vinyl acetate copolymer of which vinyl acetate content is in a range from 20 to 80% by weight;

(B) copolymer of ethylene, vinyl acetate, acrylate and/or methacrylate monomer, of which vinyl acetate content is in a range from 20 to 80% by weight, and of which acrylate and/or methacrylate monomer content is in a range from 0.01 to 10% by weight; and (C) copolymer of ethylene, vinyl acetate, maleic acid and/or maleic anhydride, of which vinyl acetate content is in a range from 20 to 80% by weight, and of which maleic acid and/or maleic anhydride content is in a range from 0.01 to 10% by weight.

In the ethylene-vinyl acetate copolymers of (A) through (C), the content of the vinyl acetate is in a range from 20 to 80% by weight, preferably from 20 to 60% by weight. Less than 20% by weight of vinyl acetate interferes with the exhibition of sufficient cross-linking in case of cross-linkage at high temperature, while more than 80% by weight decreases the softening temperature of resin in case of the ethylene-vinyl acetate copolymers of (A), (B), thereby making the storage difficult that is a problem in practical use, and tends to decrease the bond strength and the durability in case of the ethylene-vinyl acetate copolymer of (C).

In the copolymer of ethylene, vinyl acetate, acrylate and/or methacrylate monomer of (B), the content of the acrylate and/or methacrylate monomer is in a range from 0.01 to 10% by weight, preferably from 0.05 to 5% by weight. Less than 0.01% by weight of the monomer decreases the improvement of the bond strength, while more than 10% by weight tends to affect the workability. Examples of the acrylate and/or methacrylate monomer include monomers chosen from a group of acrylic ester and/or methacrylate ester monomers. Preferably employed as such a monomer is ester of acrylic acid or methacrylic acid and substituted aliphatic alcohol having non-substituting group or substituting group, such as epoxy group, including carbon atoms 1 through 20, particularly, 1 through 18. Examples include methyl acrylate, methyl methacrylate, ethyl acrylate, and glycidyl methacrylate.

In the copolymer of ethylene, vinyl acetate, maleic acid and/or maleic anhydride of (C), the content of the maleic acid and/or maleic anhydride is in a range from 0.01 to 10% by weight, preferably from 0.05 to 5% by weight. Less than 0.01% by weight of the content decreases the improvement of the bond strength, while more than 10% by weight tends to affect the workability.

The polymer according to the present invention contains more than 40% by weight, particularly more than 60% by weight, of the ethylene-vinyl acetate copolymer of (A) through (C) and preferably consists of the ethylene-vinyl acetate copolymer of (A) through (C) without other component. When the polymer contains polymer besides the ethylene-vinyl acetate copolymer, the polymer besides the ethylene-vinyl acetate copolymer may be olefin polymer of which backbone contains more than 20 mole % of ethylene and/or propylene, polyvinyl chloride, acetal resin, or the like. The crosslinking agent for the aforementioned polymer may be organic peroxide as a crosslinking agent for heat curing to form a thermosetting adhesive layer or may be photosensitizer as a crosslinking agent for photo-curing to form a photo-curing adhesive layer.

Such organic peroxide may be any organic peroxide that can be decomposed at a temperature above 70° C. to generate radical, preferably organic peroxide of which decomposition temperature during half-life period of 10 hours is higher than 50° C., and should be selected according to the temperature for applying the adhesive material, the preparation condition, the storage stability, the temperature for curing (bonding), and the heat resistance of the adherend.

Examples of available peroxide includes 2,5-dimethylhexane-2,5-dihydro peroxide; 2,5-dimethyl-2,5-di (tert-butyl-peroxy)-hexane-3; di-tert-butyl peroxide; tert-butylcumyl peroxide; 2,5-dimethyl-2,5-di (tert-butyl-peroxy)-hexane; dicumyl peroxide; α,α'-bis (tert-butyl peroxy)-benzene; n-buthyl-4,4-bis (tert-butyl-peroxy)-valerate; 2,2-bis (tert-butyl-peroxy)-butane, 1,1-bis (tert-butyl-peroxy)-cyclohexane; 1,1-bis (tert-butyl-peroxy)-3,3,5-trimethylcyclohexane; tert-butyl peroxy benzoate; benzoyl peroxide; tert-butyl peroxy acetate; methyl ethyl ketone peroxide; 2,5-dimethylhexyl-2,5-bis-peroxy-benzoate; butyl hydroperoxide; p-menthane hydroperoxide; p-chlorbenzoyl peroxide; hydroxyheptyl peroxide; chlorhexanon peroxide; octanoyl peroxide; decanoyl peroxide; lauroyl peroxide; cumyl peroxy octoate; succinic acid peroxide; acetyl peroxide; tert-butyl-peroxy (2-ethylhexanoate); m-toluoyl peroxide; tert-butyl-peroxyisobutyrate; and 2,4-dichlorobenzoyl peroxide. These are used alone or in a mixed state, normally from 0.1 to 10% by weight relative to the aforementioned polymer.

On the other hand, suitably employed as such photosensitizer (photopolymerization initiator) is radical photopolymerization initiator. Available hydrogen-drawn type initiators among radical photopolymerization initiators include benzophenone; methyl o-benzoylbenzoate; 4-benzoyl-4'-methyl diphenyl sulfide; isopropylthioxanthone; diethylthioxanthone; and 4-(diethylamino) ethyl benzoate. Among radical photopolymerization initiators, intramolecular cleavage type initiators include benzoin ether, benzoin propyl ether, and benzyldimethl ketal, α-hydroxyalkyphenon type initiators include 2-hydroxy-2-methyl-1-phenylpropane-1-on, 1-hydroxycyclohexyl phenyl ketone, alkyl phenyl glyoxylate, and diethoxy acetophenone, α-aminoalkylphenone type initiators include 2-methyl-1-[4-(methylthio) phenyl]-2-morpholino propane-1, and 2-benzyl-2-dimethylamino-1-(4-morpholino phenyl) butanone-1, and acylphosphine oxide may be employed. These are used alone or in mixed state, normally from 0.1 to 10% by weight relative to the aforementioned polymer.

The adhesive layer according to the present invention preferably includes silane coupling agent as adhesive accelerator. Examples of the silane coupling agent include vinyltriethoxysilane, vinyl-tris (β-methoxyethoxy) silane, γ-methacryloxypropyl trimethoxy silane, vinyltriacetoxy silane, γ-glycidoxypropyltrimetoxysilane, γ-glycidoxypropyltrietoxysilane, β-(3,4-epoxycyclohexyl) ethyl trimethoxy silane, vinyltrichlorosilane, γ-mercaptopropyl trimethoxy silane, γ-aminopropyl triethoxy silane, and N- (β-aminoethyl)-γ-aminopropyl trimethoxy silane. These are used alone or in the mixed state, normally from 0.1 to 10% by weight relative to the aforementioned polymer.

The adhesive accelerator may contain an epoxy group containing compound. Examples of the epoxy group containing compound include triglycidyl tris(2-hydroxy ethyl) isocyanurate, neopentyl glycol diglycidyl ether, 1,6-hexane diol diglycidyl ether, alyl glycidyl ether, 2-ethyl hexyl glycidyl ether, phenyl glycidyl ether, phenol (EO)$_5$ glycidyl ether, p-tert-butyl phenyl glycidyl ether, diglycidylester adipate, diglycidylester phthalate, glycidyl methacrylate, and butyl glycidyl ether. The same effect can be obtained by alloying polymer containing epoxy group. These epoxy group containing compounds are used alone or in the mixed state, normally from 0.1 to 20% by weight relative to the aforementioned polymer.

In order to improve the properties (such as mechanical strength, adhesive property, optical property, heat resistance, moisture resistance, weatherability, and crosslinking speed) of the adhesive layer, a compound containing one selected from acryloxy group or methacryloxy group and one selected from allyl group may be added into the adhesive layer.

Such a compound used for this purpose is usually acrylic acid or methacrylic acid derivative, for example, ester or amide thereof. Examples of ester residues include alkyl group such as methyl, ethyl, dodecyl, stearyl, and lauryl and, besides such alkyl group, cycloxyhexyl group, tetrahydro-furfuryl group, aminoethyl group, 2-hydroethyl, 3-hydroxypropyl group, and 3-chloro-2-hydroxypropyl group. Ester with polyfunctional alcohol such as ethylene glycol, triethylene glycol, polypropylene glycol, polyethylene glycol, trimethylolpropane, or pentaerythritol may be also employed. The typical one of such amide is diacetone acrylamide. Examples of polyfunctional crosslinking aid include acrylic ester or methacrylate ester such as trimethylolpropane, pentaerythritol, glycerin, and compounds having allyl group such as triallyl cyanurate, triallyl isocyanurate, diallyl phthalate, diallyl isophthalate, and diallyl maleate. These are used alone or in the mixed state, normally from 0.1 to 50% by weight, preferably from 0.5 to 30% by weight relative to the aforementioned polymer. More than 50% by weight of the content sometimes affects the working efficiency during preparation and the applying efficiency of the adhesive material.

In order to improve the workability and the ply adhesion of the adhesive layer, hydrocarbon resin may be added into the adhesive layer. Such hydrocarbon resin to be added for this purpose may be either natural resin or synthetic resin. Examples suitably employed as natural resin are rosin, rosin derivative, and terpene resin. Employed as rosin may be gum rosin, tall oil rosin, or wood rosin. Employed as rosin derivative is rosin which has been hydrogenated, disproportioned, polymerized, esterifyed, or metallic chlorinated. Employed as terpene resin may be terpene resin, such as α-pinene and β-pinene (nopinene), or terpene phenol resin. Besides the above natural resin, dammar, copal, or shellac may be employed. Examples suitably employed as synthetic resin are petroleum resin, phenolic resin, and xylene resin. Employed as petroleum resin may be aliphatic petroleum resin, aromatic petroleum resin, cycloaliphaticb petroleum resin, copolymer petroleum resin, hydrogenated petroleum resin, pure monomer petroleum resin, or coumarone-indene resin. Employed as phenolic resin may be alkylphenolic resin or modified phenolic resin. Employed as xylene resin may be xylene resin or modified xylene resin. The content of the hydrocarbon resin should be suitably selected, preferably from 1 to 200% weight, more preferably from 5 to 150% weight relative to the polymer.

The adhesive layer may further include antioxidant, ultraviolet absorbing agent, dye, and/or processing aid in such an amount not to affect the object of the present invention.

Examples of metal of the metallic foil 7A as the base of the cross-linkable conductive adhesive tape 7 of the present invention include copper, silver, nickel, aluminum, or stainless steel. The thickness of the metallic foil 7A is normally in a range from 1 to 100 μm.

The adhesive layer 7B is made of mixture in which the ethylene-vinyl acetate copolymer, cross-linking agent, other additives if necessary, and conductive particles are mixed uniformly in a predetermined ratio, and can be easily formed by applying the mixture onto the metallic foil 7A using a roll coater, a die coater, a knife coater, a micabar coater, a flow coater, a spray coater or the like.

The thickness of the adhesive layer 7B is normally in a range from 5 to 100 μm.

In the electromagnetic-wave shielding and light transmitting plate of the present invention, examples of material of the transparent base plates 2A, 2B include glass, polyester, polyethylene terephthalate (PET), polybutylene terephthalate, polymethyl methacrylate (PMMA), acrylic board, polycarbonate (PC), polystyrene, triacetate film, polyvinyl alcohol, polyvinyl chloride, polyvinylidene chloride, polyethylene, ethylene-vinyl acetate copolymer, polyvinylbutyral, metal ionic cross-linked ethylene-methacrylic copolymer, polyurethane, and cellophane. Preferably selected from the above materials are glass, PET, PC, and PMMA.

The thicknesses of the transparent base plates 2A, 2B are suitably determined in accordance with requirements (e.g. strength, light weight) due to the application of a plate to be obtained and are normally in a range from 0.1 to 10 mm.

The transparent base plates 2A, 2B are not necessarily made of the same material. For example, in a case of a PDP front filter of which only the front surface is required to have scratch resistance and durability, the transparent base plate 2A as the front surface may consist of a glass plate having a thickness of 1.0 to 10 mm and the transparent base plate 2B as the rear surface (at the electromagnetic wave source side) may consist of a PET film or PET board, an acrylic film or acrylic board, or a polycarbonate film or polycarbonate board having a thickness of 1 μm to 10 mm.

In the electromagnetic-wave shielding and light transmitting plate of this embodiment, acrylic resin-based black painting 6 is provided in a frame shape on the peripheral portion of the rear surface of the transparent base plate 2B.

In the electromagnetic-wave shielding and light transmitting plate 1 of this embodiment, an antireflection film 5 is formed on the surface of the transparent base plate 2A as the front surface. The antireflection film 5 formed on the surface of the transparent base plate 2A is a laminated film of a high-refractive transparent film and a low-refractive transparent film and examples of the laminated film are as follows:

(a) a laminated film consisting of a high-refractive transparent film and a low-refractive transparent film, i.e. two films in total;

(b) a laminated film consisting of two high-refractive transparent films and two low-refractive transparent films which are alternately laminated, i.e. four films in total;

(c) a laminated film consisting of a medium-refractive transparent film, a high-refractive transparent film, and a low-refractive transparent film, i.e. three films in total; and (d) a laminated film consisting of three high-refractive transparent films and three low-refractive transparent films which are alternately laminated, i.e. six films in total.

As the high-refractive transparent film, a film, preferably a transparent conductive film, having a refractive index of 1.8 or more can be made of $ZnO$, $TiO_2$, $SnO_2$, or $ZrO$ in which ITO (tin indium oxide) or ZnO, Al is doped. On the other hand, as the low-refractive transparent film, a film can be made of low-refractive material having a refractive index of 1.6 or less such as $SiO_2$, $MgF_2$, or $Al_2O_3$. The thicknesses of the films vary according to the film structure, the film kind, and the central wavelength because the refractive index in a visible-light area is reduced by interference of light. In case of four-layer structure, the antireflection film is formed in such a manner that the first layer (high-refractive transparent film) is from 5 to 50 nm, the second layer (low-refractive transparent film) is from 5 to 50 nm, the third layer (high-refractive transparent film) is from 50 to 100 nm, and the fourth layer (low-refractive transparent film) is from 50 to 150 min thickness.

The antireflection film may be further formed with an antifouling film to improve the fouling resistance of the surface. The antifouling film is preferably a fluorocarbon or silicone film having a thickness in a range from 1 to 1000 nm. The transparent base plate 2A as the front surface of the electromagnetic-wave shielding and light transmitting plate of the present invention may be further processed by hard coating with silicone material and/or anti-glare finish by hard coating including light-scattering agent. On the other hand, the transparent base plate 2B as the rear surface may be processed by heat ray reflection coating with a metallic film or a transparent conductive film to improve its function. A transparent conductive film may also be formed on the transparent base plate 2A as the front surface.

It is preferable that the conductive mesh member, made of metallic fibers and/or metal-coated organic fibers, to be interposed between the transparent base plates 2A, 2B has a wire diameter between 1 μm and 1 mm and an open area ratio between about 50% and about 90%. When the wire diameter is more than 1 mm, the open area ratio is reduced or the electromagnetic-wave shielding efficiency is reduced and it is impossible to satisfy the both the open area ratio and the electromagnetic-wave shielding efficiency. When the wire diameter is less than 1 μm, it reduces the strength of the mesh member to make the handling significantly difficult. When the open area ratio is more than 90%, it is difficult to maintain the mesh configuration. On the other hand, when the open area ratio is less than 50%, too low light transmittance is provided so as to reduce the light from the display. It is more preferable that the wire diameter is between 10 and 500 μm and the open area ratio is between 60 and 90%.

The ratio of opening areas of the conductive mesh member means the ratio of areas, where the openings occupy, relative to the projected area of the conductive mesh member.

Examples of metal of metallic fibers and metal-coated organic fibers constituting the conductive mesh member include copper, stainless steel, aluminum, nickel, titanium, tungsten, tin, lead, iron, silver, chrome, carbon, or alloy thereof. Preferably selected from the above are copper, stainless steel, and aluminum.

Examples of organic material of the metal-coated organic fibers include polyester, nylon, vinylidene chloride, aramid, vinylon, and cellulose.

In this invention, since the margins of the conductive mesh member are folded, the conductive mesh member is preferably made of metallized organic fibers having high toughness.

Examples of adhesive resin for bonding such transparent base plates 2A, 2B via the conductive mesh 3 include copolymers of ethylene group, such as ethylene-vinyl acetate copolymer, ethylene-methyl acrylic copolymer, ethylene-(meth) acrylic copolymer, ethylene-ethyl (meth) acrylic copolymer, ethylene-methyl (meth) acrylic copolymer, metal ionic cross-linked ethylene-(meth) acrylic copolymer, partial saponified ethylene-vinyl acetate copolymer, and calboxylated ethylene-vinyl acetate copolymer (it should be noted that "(meth) acrylic" means "acrylic or methacrylic"). The best one among the aforementioned resins is ethylene-vinyl acetate copolymer (EVA) because it can provide the best balance of performance and can be easily handled.

The integrated member of the transparent base plates 2A, 2B and the conductive mesh member 3 can be easily made by sandwiching the conductive mesh member 3 between two adhesive films 4A, 4B, in which a predetermined amount of a crosslinking agent for heat curing or photo-curing are mixed to the resin such as EVA, interposing them between the transparent base plates 2A and 2B, decompressing and deaerating them under the heated condition, and hardening the adhesive layer by heating or irradiation to integrate them.

The thickness of the adhesive layer consisting of the conductive mesh member and the adhesive materials can vary according to the application of the electromagnetic-wave shielding and light transmitting plate and is normally between 2 $\mu$m and 2 mm. Therefore, each adhesive film 4A, 4B is formed to have a thickness from 1 $\mu$m to 1 mm to make the adhesive layer having such a thickness.

The conductive mesh member 3 is formed to have an area larger than that of the transparent base plate 2A, 2B so that the periphery thereof is positioned outside of the peripheral edges of the transparent base plates so as to form margins when it is interposed therebetween. The conductive mesh member 3 is preferably formed in such a size that the margins of the conductive mesh member 3 are folded to cover parts of the surface of the transparent base plate 2A and the width of the portion covering the parts is in a range from 3 to 20 mm.

After the transparent base plates 2A, 2B and the conductive mesh member 3 are integrated, the margins of the conductive mesh member 3 are folded, and the conductive adhesive tape or cross-linkable conductive adhesive tape 7 is wound onto the periphery of the integrated member to fix the margins onto the surface and is bonded according to a hardening method, such as thermo compression bonding, suitable for the employed conductive adhesive tape or cross-linkable conductive adhesive tape 7.

When using the cross-linkable conductive adhesive tape 7, the tape 7 is bonded on the integrated member by the tackiness of the tape 7 (this temporal adhesion allows re-adhesion if necessary) and is then heated or radiated with ultraviolet with some pressures as necessary. The ultraviolet radiation may be applied at the same time of heating. The cross-linkable conductive tape 7 may be partially bonded by partially heating or radiating ultraviolet.

The thermo compression bonding can be easily conducted by a normal heat sealer. As one of compression and heating methods, a method may be employed, wherein the integrated member bonded with the cross-linkable conductive adhesion tape is inserted into a vacuum bag which is then vacuumed and after that it is heated. Therefore, the bonding operation is quite easy.

The bonding condition in case of thermal cross-linking depends on the type of the crosslinking agent (organic peroxide) to be employed. The cross-linking is conducted normally at a temperature from 70 to 150° C., preferably from 70 to 130° C. and normally for 10 seconds to 120 minutes, preferably 20 seconds to 60 minutes.

In case of optical cross-linking, many light sources emitting in a ultraviolet to visible range may be employed. Examples include an extra-high pressure, high pressure, or low pressure mercury lamp, a chemical lamp, a xenon lamp, a halogen lamp, a Mercury halogen lamp, a carbon arc lamp, an incandescent lamp, and a laser radiation. The period of radiation is not limited because it depends on the type of lamp and the strength of the light source, but normally in a range from dozens of seconds to dozens of minutes. In order to aid the cross-linking, ultraviolet may be radiated after previously heating to 40–120° C.

The pressure for bonding should be suitably selected and is preferably 0–50 kg/cm$^2$, particularly 0–30 kg/cm$^2$.

The electromagnetic-wave shielding and light transmitting plate 1 onto which the conductive adhesive tape or cross-linkable conductive adhesive tape 7 are bonded can be easily built in the body of an equipment only by fitting it in the body of the equipment in the peripheral direction and can provide uniform conduction between the conductive mesh member 3 and the body of the equipment through the conductive adhesive tape or cross-linkable conductive adhesive tape 7, thereby exhibiting good electromagnetic-wave shielding efficiency.

The electromagnetic-wave shielding and light transmitting plate shown in FIG. 1 is just one of examples of the electromagnetic-wave shielding and light transmitting plate of this invention and it is to be understood that this invention is not limited thereto. For example, while the conductive mesh member 3 is formed such that the periphery thereof is positioned outside of the peripheral edges of the transparent base plates 2A, 2B and is folded in the drawing, the conductive mesh member 3 may be formed such that only two sides thereof are positioned outside of the edges of the transparent base plates 2A, 2B and are folded.

The electromagnetic-wave shielding and light transmitting plate of the present invention as mentioned above is quite suitable for a front filter of PDP and a window of a place where a precision apparatus is installed, such as a hospital or a laboratory.

As mentioned above, the electromagnetic-wave shielding and light transmitting plate of the present invention can be easily built in a body of an equipment as an object of installation and can provide uniform and low-resistant conduction relative to the body of the equipment, thereby exhibiting high electromagnetic-wave shielding efficiency.

Furthermore the use of a conductive adhesive tape or cross-linkable conductive adhesive tape facilitates the assemblage of the electromagnetic-wave shielding and light transmitting plate.

What is claimed is:

1. An electromagnetic-wave shielding and light transmitting plate comprising two transparent base plates and a conductive mesh member wherein said conductive mesh member is interposed between said transparent base plates in such a manner that a periphery of said conductive mesh member is positioned outside of said transparent base plates and the periphery is folded along peripheral edges of one of the transparent base plates, and wherein said periphery of said conductive mesh member positioned outside of said transparent base plates is secured to said transparent base plates by a conductive adhesive tape.

2. An electromagnetic-wave shielding and light transmitting plate as claimed in claim 1, wherein the conductive adhesive tape is a cross-linkable conductive adhesive tape.

3. An electromagnetic-wave shielding and light transmitting plate as claimed in claim 2, wherein said cross-linkable conductive adhesive tape comprises a metallic foil and an adhesive layer, in which conductive particles are dispersed, disposed on said metallic foil, and wherein said adhesive layer is a post-cross-linkable adhesive layer containing polymer of which principal components are ethylene-vinyl acetate copolymer and a cross-linking agent for said copolymer.

4. An electromagnetic-wave shielding and light transmitting plate as claimed in claim 3, wherein said polymer contains the ethylene-vinyl acetate copolymer selected from the followings (A) through (C), and has melt index (MFR) from 1 to 3000:

(A) ethylene-vinyl acetate copolymer of which vinyl acetate content is in a range from 20 to 80% by weight;

(B) copolymer of ethylene, vinyl acetate, acrylate and/or methacrylate monomer, of which vinyl acetate content is in a range from 20 to 80% by weight, and of which acrylate and/or methacrylate monomer content is in a range from 0.01 to 10% by weight; and (C) copolymer of ethylene, vinyl acetate, maleic acid and/or maleic anhydride, of which vinyl acetate content is in a range from 20 to 80% by weight, and of which maleic acid and/or maleic anhydride content is in a range from 0.01 to 10% by weight.

5. An electromagnetic-wave shielding and light transmitting plate as claimed in claim 1, wherein said conductive mesh member is made of at least one kind of fibers selected from the group consisting of metallic fibers and metal-coated organic fibers, the wire diameter being between 1 $\mu$m and 1 mm, and has an open area ratio between about 50% and about 90%.

* * * * *